United States Patent [19]

Hirata

[11] Patent Number: 4,664,762

[45] Date of Patent: May 12, 1987

[54] METHOD FOR ETCHING A SILICON SUBSTRATE

[75] Inventor: Masaki Hirata, Tokyo, Japan

[73] Assignee: NEC Corporation, Tokyo, Japan

[21] Appl. No.: 757,954

[22] Filed: Jul. 23, 1985

[30] Foreign Application Priority Data

Jul. 23, 1984 [JP] Japan .................................. 59-152275

[51] Int. Cl.⁴ ................................................ C25F 3/12
[52] U.S. Cl. .............................. 204/129.3; 204/129.43
[58] Field of Search .............. 204/129.3, 129.43, 129.4

[56] References Cited

U.S. PATENT DOCUMENTS

| | | | |
|---|---|---|---|
| 2,656,496 | 10/1953 | Sparks | 204/129.4 X |
| 3,268,781 | 8/1966 | LeCan et al. | 204/129.3 |
| 3,287,239 | 11/1966 | Froschle et al. | 204/129.3 X |
| 3,518,131 | 6/1970 | Glendinning | 204/129.3 |

Primary Examiner—Donald R. Valentine
Attorney, Agent, or Firm—Burns, Doane, Swecker & Mathis

[57] ABSTRACT

A method of electrochemically etching a silicon substrate of a diaphragm type silicon pressure sensor is described. The etching process is accelerated by applying a positive voltage to, for example, an electrode of a P-type silicon layer of the substrate to be etched while the substrate is in an etchant solution.

3 Claims, 5 Drawing Figures

METHOD FOR ETCHING A SILICON SUBSTRATE

BACKGROUND OF THE INVENTION

This invention relates to a method for electrochemically etching a silicon substrate, and more particularly to an electrochemical etching method for use in forming a diaphragm of a diaphragm type silicon pressure sensor.

Heretofore, a diaphragm of a diaphragm type silicon pressure sensor has been formed by a chemical etching, an electron discharge method, or an electrochemical etching. In the chemical etching and the electron discharge method, however, it is difficult to exactly control a thickness of the diaphragm. Therefore, it is preferable to use electrochemical etching in which the etching is automatically terminated when a preset thickness is obtained. Such electrochemical etching is disclosed in an article entitled "An Electrochemical P-N Junction Etch-Stop for the Formation of Silicon Microstructures" by T. N. Jackson et al. published in the IEEE ELECTRON DEVICE LETTERS, VOL. EDL-2, Feb., 1981, pp 44–45.

In the disclosed electrochemical etching, the etching rate is low, i.e., 1 $\mu$m/min. This means that an etching time the 5–6 hours is required in order to etch a silicon substrate of 300–400 $\mu$m to 10–30 $\mu$m suitable for a thickness of a diaphragm. This etching time is too long in a formation process of a diaphragm of a pressure sensor.

OBJECTS AND SUMMARY OF THE INVENTION

It is, therefore, an object of this invention to provide an electrochemical etching in which the etching rate is high and which does not require a long etching time.

According to this invention, there is provided a method for etching one layer of a dual-layer silicon substrate composed of a first layer having a first conductivity and a second layer having a second conductivity reverse to the first conductivity. Two electrodes are connected to the first and second layers, respectively. An electric voltage is applied between the electrode and etchants, whereby the one layer of the first and second layers is etched.

Other features and advantages of this invention will be apparent from the following detailed description of preferred embodiments of this invention taken in conjunction with the accompanying drawings.

DETAILED DESCRIPTION

Figure 1A:
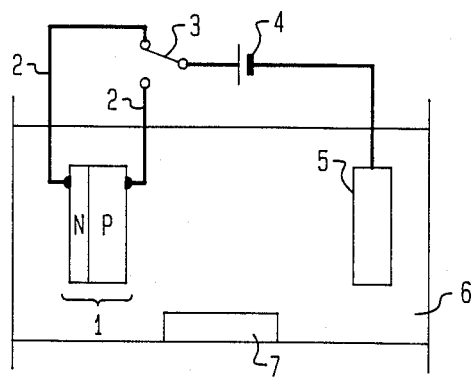
FIG. 1(a) shows a schematic arrangement used for a first embodiment of this invention.

Referring to FIG. 1(a), a dual-layer silicon substrate 1 is composed of a P-type silicon layer of (100)-oriented single-crystal having a thickness of 350 $\mu$m and a resistivity of 3–5 $\Omega$cm, and an N-type epitaxial layer having a thickness of 20 $\mu$m and a resistivity of 4 $\Omega$cm. Two insulator-coated electrode-wires 2 are connected to the P-type and N-type layers, respectively. The electrode-wires 2 are connected through a switch 3 to a positive side of a battery 4. A negative side of the battery 4 is connected to a platinum electrode 5 in etchant 6, whereby a potential of the etchant 6 is maintained to be equal to that of the negative side of the battery 4. The etchants 6 is stirred by a stir bar 7.

Figure 1B:
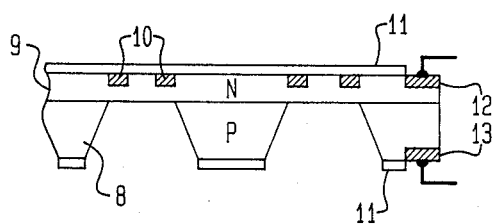
FIG. 1(b) shows a side illustrational view of diaphragm structure formed using the first embodiment.

FIG. 1(b) shows how a thin silicon diaphragm that might be used as a pressure sensor can be fabricated by using the first embodiment shown in FIG. 1(a). P-type diffusion resistors 10 for pressure sensor elements are formed on an N-type epitaxial layer 9 of the dual-layer silicon substrate 1 composed of a P-type silicon layer 8 and the N-type epitaxial layer 9. Oxide layers 11 are formed on the whole surface of the N-type layer 9 and surfaces of non-etching portions of the P-type silicon layer 8. High density N-type and P-type diffusion layers 12 and 13 are formed on the N-type and the P-type layers 9 and 8, respectively to provide electrodes to which the electrode-wires 2 are connected. The dual-layer silicon substrate 1 shown in FIG. 1(b) is selective-etched by the etching apparatus shown in FIG. 1(a).

First, the movable contact of the switch 3 is turned to the lower contact, thereby to connect the positive side of the battery 4 to the electrode 13 of the P-type silicon layer 8. Even when the P-type layer 8 is not connected to the battery 4, the etching is performed in a hydrazine hydration solution or ethylene diamine pyrocatechol. Applying an electric current to the P-type layer 8 makes it possible to alternate the etching rate. This is due to the fact that the electric current application accelerates oxidation and an etching operation of the silicon is advanced by the oxidation. For example, in case where the P-type silicon substrate having a resistivity of 3–5 $\Omega$cm is etched in hydrazine hydration solution, the etching rate, which is about 1.5 $\mu$m/min when no electric current is applied, is increased to about 2.5 $\mu$m/min by applying a DC voltage of 2V. The etching rate is increased by increasing the applied voltage.

The P-type layer 8 is deeply etched to make a diaphragm as shown in FIG. 1(b). Before the N-type epitaxial layer 9 is exposed, the switch 3 is turned to the upper contact, thereby to connect the battery 4 to the N-type layer 9. The time that for the switch 3 should be actuated can be easily determined with reference to the thickness of the P-type silicon layer 8 and the etching rate. It is unnecessary to exactly control the time of actuation and it is sufficient to actuate the switch at an approximate time when the etching has not been reached the N-type layer 9.

When the connection of the battery 4 is changed to the N-type layer 9, the etching rate of the P-type layer 8 is changed to the lower rate, whereby the P-type layer 8 is slowly etched and then the etching of the N-type layer 9 is started. However, since the positive voltage is applied to the N-type layer 9 and the oxidation is accelerated, an oxide layer is formed, whereby the etching is practically stopped. Incidentally, since the applied voltage to the P-N junction is reverse-biased, the etching of the P-type layer 8 is not stopped.

Figure 2:
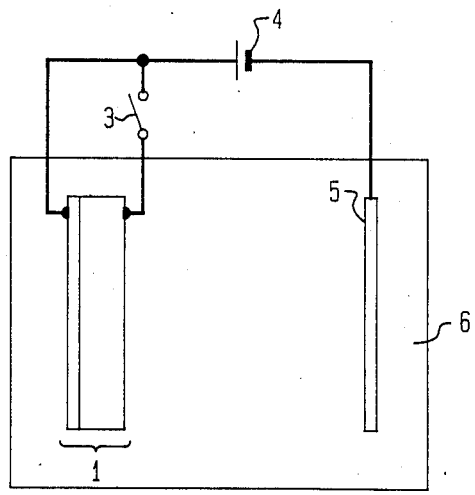
FIGS. 2 and 3 show arrangements used for a second and a third embodiments of this invention.

Referring to FIG. 2, a second embodiment is identical to the first embodiment except that the battery 4 is always connected to the N-type layer 9 and a switch 3' is closed to connect the battery 4 to the P-type layer 8 during the etching operation and cut-off immediately before the etching has been reached the N-type layer 9.

Figure 3:
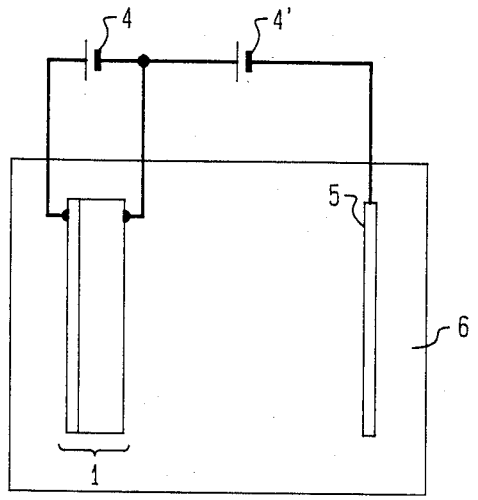

Referring to FIG. 3, a third embodiment is identical to the first embodiment except that the voltage from the battery 4 is applied between the P-type and the N-type layers 9 and 8 for anodic-oxidizing the N-type layer 9 and another battery 4' is installed between the P-type layer 8 and the etchents 6 for increasing the etching rate. The voltage of the battery 4' is selected so that the P-type layer 8 is not oxidized.

Figure 4:
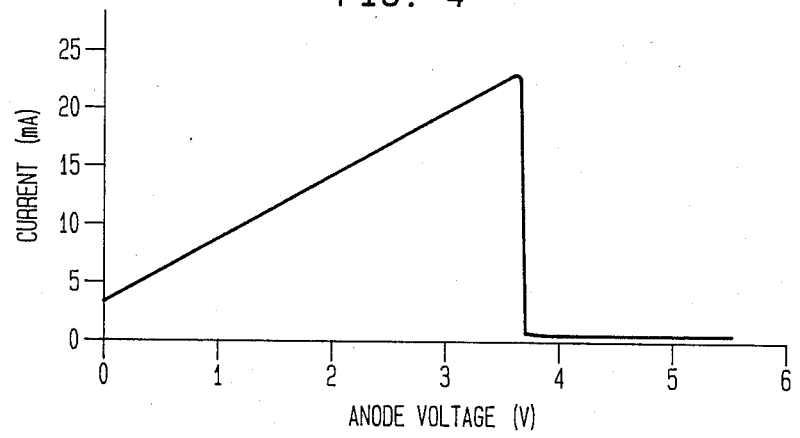
FIG. 4 is an I-V characteristic in the electrochemical etching.

FIG. 4 shows an anodic characteristic of the N-type layer, when an anode voltage is higher than 3.6 V, an anodic oxide layer is formed, thereby to cut off the electric current.

What is claimed is:

1. A method for etching one layer of a dual-layer silicon substrate having a first N-type silicon layer and a second P-type silicon layer, comprising the steps of:
   placing the substrate in an etchant;
   connecting an electrode to each of said first and second layers;
   applying a voltage between said electrodes including the steps of connecting the electrode on said P-type silicon layer to a positive terminal of a voltage source supplying said voltage, and connecting a negative terminal of said voltage source to said etchant;
   providing a switch selectively connecting said positive terminal of the voltage source and one of said electrodes, and setting the switch in a first position to connect to the P-type silicon layer to thereby increase the rate of etching; and
   when etching of the P-type silicon layer is approximately complete, moving the switch to a second position to connect the positive terminal of the voltage supply to the electrode of the N-type silicon layer whereby anodic-oxidization of said N-type silicon layer is accelerated concurrently with reduced rate of etching of said P-type silicon layer.

2. A method for etching one layer of a dual-layer silicon substrate having a first N-type silicon layer and a second P-type silicon layer, comprising the steps of:
   placing the substrate in an etchant;
   forming an electrode on each of said first and second layers;
   connecting a positive terminal of a voltage source to said electrode on said N-type silicon layer;
   connecting a negative terminal of said voltage source to said etchant;
   providing a switch selectively connecting said positive terminal to said electrode on said P-type silicon layer including the step of setting it at first to make said connection; and
   when etching of the P-type silicon layer is approximately complete, thus about to reach the N-type silicon layer, opening said switch to disconnect said P-type silicon layer from said positive terminal.

3. A method for etching one layer of a dual-layer silicon substrate having a first N-type silicon layer and a second P-type silicon layer, comprising the steps of:
   placing the substrate in an etchant;
   forming an electrode on each of said first and second layers;
   connecting a positive terminal of a first voltage source to said electrode on said N-type silicon layer;
   connecting a negative terminal of said first voltage source to said electrode on said P-type silicon layer and also to a positive terminal of a second voltage source;
   connecting a negative terminal of said second voltage source to said etchant.

* * * * *